United States Patent
Shirasaki et al.

(10) Patent No.: US 10,651,004 B2
(45) Date of Patent: May 12, 2020

(54) CHARGED PARTICLE BEAM DEVICE

(71) Applicant: HITACHI, LTD., Chiyoda-ku, Tokyo (JP)

(72) Inventors: Yasuhiro Shirasaki, Tokyo (JP); Momoyo Enyama, Tokyo (JP)

(73) Assignee: HITACHI, LTD., Tokyo (JP)

( * ) Notice: Subject to any disclaimer, the term of this patent is extended or adjusted under 35 U.S.C. 154(b) by 56 days.

(21) Appl. No.: 16/089,269

(22) PCT Filed: Mar. 31, 2016

(86) PCT No.: PCT/JP2016/060781
§ 371 (c)(1),
(2) Date: Sep. 27, 2018

(87) PCT Pub. No.: WO2017/168709
PCT Pub. Date: Oct. 5, 2017

(65) Prior Publication Data
US 2019/0131104 A1    May 2, 2019

(51) Int. Cl.
*H01J 37/05* (2006.01)
*H01J 37/26* (2006.01)
*H01J 37/147* (2006.01)
*H01J 37/153* (2006.01)
*H01J 37/28* (2006.01)

(52) U.S. Cl.
CPC .......... *H01J 37/05* (2013.01); *H01J 37/1475* (2013.01); *H01J 37/153* (2013.01); *H01J 37/265* (2013.01); *H01J 37/28* (2013.01); *H01J 2237/15* (2013.01); *H01J 2237/1536* (2013.01)

(58) Field of Classification Search
CPC .......... H01J 37/05; H01J 37/265; H01J 37/28; H01J 37/153; H01J 37/1475; H01J 2237/15; H01J 2237/1536
See application file for complete search history.

(56) References Cited

U.S. PATENT DOCUMENTS

| 5,319,207 | A | 6/1994 | Rose et al. | |
| 9,312,093 | B1* | 4/2016 | Fober | H01J 37/1471 |
| 2002/0024023 | A1* | 2/2002 | Brunner | H01J 37/28 250/492.23 |
| 2004/0227081 | A1* | 11/2004 | Sato | H01J 37/05 250/310 |

(Continued)

*Primary Examiner* — Brooke Purinton
(74) *Attorney, Agent, or Firm* — Miles & Stockbridge, P.C.

(57) ABSTRACT

A charged particle beam device that detects a secondary charged particle beam generated by irradiation of a sample by a primary charged particle beam, includes: an image shift deflector that shifts an irradiation region for irradiation of the sample by the primary charged particle beam; a magnetic sector that separates the primary charged particle beam passing therein from the secondary charged particle beam from the sample using a magnetic field generated therein; a correction mechanism that is placed off of a trajectory of the primary charged particle beam but on a trajectory of the secondary charged particle beam inside the magnetic sector, the correction mechanism deflecting the secondary charged particle beam passing through; and a controller that controls the correction mechanism according to a defined relationship between a shift amount by the image shift deflector and a correction amount by the correction mechanism.

14 Claims, 10 Drawing Sheets

(56) References Cited

U.S. PATENT DOCUMENTS

| | | | | |
|---|---|---|---|---|
| 2005/0263715 | A1* | 12/2005 | Nakasuji | H01J 37/141 250/396 ML |
| 2010/0155597 | A1* | 6/2010 | Preikszas | H01J 37/05 250/310 |
| 2010/0320382 | A1* | 12/2010 | Almogy | H01J 37/05 250/307 |
| 2011/0139978 | A1* | 6/2011 | Frosien | H01J 37/147 250/307 |
| 2015/0014531 | A1* | 1/2015 | Yamazaki | H01J 37/244 250/311 |
| 2015/0357153 | A1* | 12/2015 | Makino | H01J 37/147 250/310 |

* cited by examiner

FRONT VIEW

CROSS-SECTIONAL VIEW

CHARGED PARTICLE BEAM DEVICE

BACKGROUND

The present invention relates to a charged particle beam device.

Charged particle beam devices are used in order to observe minute structures. During a semiconductor manufacturing process, charged particle beam devices that employ charged particle beams such as electron beams to measure or inspect the dimensions or the shapes of semiconductor devices are used. One example is a scanning electron microscope (SEM). An SEM radiates an electron beam (hereinafter, primary beam) generated from an electron source to a sample to be observed, and secondary electrons generated as a result are detected by a detector and converted to an electrical signal, thereby generating an image.

In order to detect secondary electrons, it is necessary to separate the trajectory of the secondary electrons (hereinafter, secondary beam) from the primary beam. Patent Document 1, for example, discloses a magnetic sector as an optical device to perform such separation. The magnetic sector consists of two magnetic plates with coils embedded for exciting a magnetic field. The primary beam and secondary beam are deflected in different directions by the magnetic field in the magnetic sector and thus separated.

When shifting the field of view, it is effective to deflect the primary beam by a deflector using an electric field or a magnetic field, thereby shifting (hereinafter referred to as image shift) the irradiation position on the sample. The irradiation position on the sample affects the secondary beam. Patent Document 2 discloses an E×B filter that generates an electric field and a magnetic field that deflect only the secondary beam and not the primary beam. In Patent Document 2, the secondary beam is controlled such that during an image shift, the E×B causes the change in trajectory of the secondary beam to be corrected.

Patent document 1: U.S. Pat. No. 5,319,207
Patent document 2: US 2015/0357153

SUMMARY

Two conditions are desired for a secondary beam optical system of a charged particle beam device. First, information of secondary electrons is separated out by a secondary electron information separator such as a spectrometer that separates secondary electrons by their energies. In order to position the secondary electron information separator so as not to affect the primary beam, it is preferable that the primary beam and secondary beam be separated by a large angle. This is the first condition.

If a change in incident position or angle of the secondary beam by an image shift causes the signal at the secondary electron information separator to change, false detection of a change in information of the secondary electrons can occur and leads to a degradation in the accuracy of secondary electron information separation. That is, the second condition is that the entry condition of the secondary beam entering the secondary electron information separator is not dependent on the amount of image shift.

A magnetic sector is effective in satisfying the first condition and the E×B filter disclosed in Patent Document 2 is effective in satisfying the second condition. One possible configuration to satisfy both conditions is a combination in which, after the E×B causes the trajectory of the secondary beam to be restored, the magnetic sector causes the primary beam and the secondary beam to be separated by a large angle.

However, the combination of the E×B filter and the magnetic sector would result in an increased column length of the device (distance from electron source to sample), which results in increased susceptibility to effects of vibration from the outside. As a result, the resolution of the primary beam is reduced. Also, the E×B filter does not deflect the primary beam but does cause an aberration, resulting in a decrease in resolution of the primary beam. Thus, there is demand for a charged particle beam device that can mitigate decreases in beam resolution while satisfying both of the above-mentioned conditions.

An example of the present invention is a charged particle beam device that detects a secondary charged particle beam generated by irradiation of a primary charged particle beam onto a sample, where the charged particle beam device includes: an image shift deflector that shifts the region on the sample irradiated by the primary charged particle beam; a magnetic sector that separates the primary charged particle beam passing therein from the secondary charged particle beam from the sample using a magnetic field generated therein; a correction mechanism that is placed off of the trajectory of the primary charged particle beam but on the trajectory of the secondary charged particle beam inside the magnetic sector; the correction mechanism deflecting the secondary charged particle beam passing through; and a controller that controls the correction mechanism according to a defined relationship between a shift amount by the image shift deflector and a correction amount by the correction mechanism.

Another aspect of the present invention is a charged particle beam device that detects a secondary charged particle beam generated by irradiation of a sample by a primary charged particle beam, where the charged particle beam device includes: an image shift deflector that shifts the region on the sample irradiated by the primary charged particle beam; a correction mechanism that is placed off of a trajectory of the primary charged particle beam but on a trajectory of the secondary charged particle beam, the correction mechanism deflecting the secondary charged particle beam passing through; and a controller that controls the correction mechanism according to a defined relationship between a shift amount by the image shift deflector and a correction amount by the correction mechanism. When setting the control information of the correction mechanism, the controller generates, as a reference image, an image of a secondary charged particle beam of a first pattern in a reference image shift amount, determines a correction amount for differing image shift amounts such that a difference between the image of the secondary charged particle beam of the first pattern and the reference image for the reference image shift amount and each of the differing image shift amounts is within a defined range, and stores a relationship between the differing image shift amounts and the determined correction amount as a preset relationship.

According to the present invention, in the charged particle beam device, it is possible to reduce the effect of the image shift on secondary electron information separation while mitigating the decrease in beam resolution.

DETAILED DESCRIPTION OF THE EMBODIMENTS

Hereinafter, embodiments of present invention will be described with reference to the accompanying drawings. It should be noted that the embodiments are merely examples to implement present invention and is not to limit the technical scope of present invention. Elements common to the drawings are denoted by the same reference signs.

Embodiment 1

Figure 1:
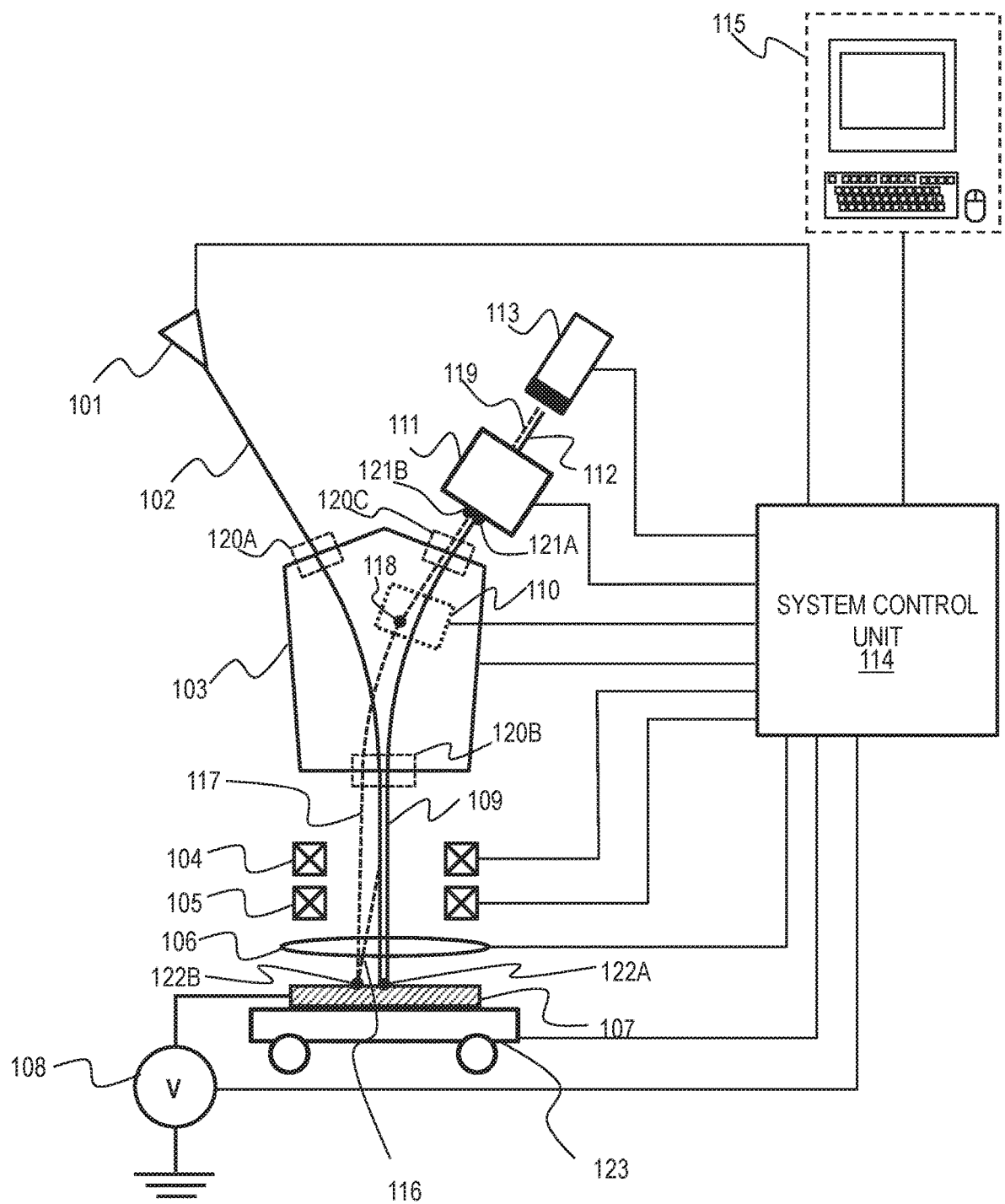
FIG. 1 is a diagram showing a schematic configuration of an electron beam observation device according to Embodiment 1 and the trajectory of the electron beam during an image shift.

FIG. 1 shows a schematic configuration of an electron beam observation device according to Embodiment 1, which is an example of a charged particle beam device. First the configuration of the electron beam observation device will be described. A magnetic sector 103, an image shift deflector 104, a scanning deflector 105, and an objective lens 106 are positioned on the trajectory of a primary beam 102 from an electron source 101 aimed at a sample 107.

The primary beam 102 radiated onto the sample 107 interacts with substances near the surface of the sample 107, causing a secondary beam 109 to be generated. As optical elements that act on the secondary beam 109, a secondary beam correction mechanism 110 inside the magnetic sector 103, a secondary electron information separator 111, and a detector 113 are provided. The secondary electron information separator 111 and the detector 113 are placed outside of the magnetic sector 103. The specific configuration of the secondary electron information separator 111 will be described later.

The sample 107 is placed on a sample conveyance stage 123. In the magnetic sector 103, the secondary beam correction mechanism 110 is placed off of the trajectory of the primary beam 102 and on the trajectory of the secondary beam 109. In order to adjust the current and axes of the electron beams, apertures, lenses, aligners, stigmators, and the like may be added (not shown). In the present specification, elements that have an effect on the charged particle beam such as the electron source, the lens, the aligner, and the detector are collectively referred to as optical elements.

The image shift deflector 104, the scanning deflector 105, and the objective lens 106 in the present embodiment generate a magnetic field by an excitation current passed through the coil of each optical element, which affects the electron beam 102. These optical elements may generate an electric field or a combination of magnetic field and electric field, thereby affecting the electron beam 102.

All of the above-mentioned optical elements are controlled by a system control unit 114. The system control unit 114 controls the amount of current and voltage to be applied to each optical element, for example. A user can confirm and change settings for each optical element using a user terminal 115. The user terminal 115 is a computer including input/output devices.

The method for acquiring an image of the sample using the configuration of this device will be described. In this electron beam observation device, the method for controlling the electron beam observation device by the system control unit 114 differs between a state in which the image shift function, which deflects the primary beam 102 and changes the irradiation position on the sample 107, is turned off, and a state in which the image shift function is turned on.

First, the method for acquiring an SEM image in the case in which the image shift function is turned off, that is, in which the image shift deflector 104 is turned off, will be described with reference to FIG. 1. The electron beam 102 emitted from the electron source 101 enters the magnetic sector 103 through an entrance/exit 120A of the magnetic sector 103.

The magnetic sector 103 includes a pair of magnetic plates and a plurality of coils embedded therein. The magnetic sector 103 generates a magnetic field between the magnetic plates by an excitation current through the coils. The magnetic sector 103 and the excitation current thereof are designed and controlled such that the primary beam 102 entering therein is deflected by 30 degrees, for example, and the primary beam 102, having been deflected by 30 degrees, exits an entrance/exit 120B of the magnetic sector 103.

The primary beam 102 that has exited the magnetic sector 103 passes through the image shift deflector 104, the scanning deflector 105, and the objective lens 106, after which it is focused onto a position 122A on the sample 107. The excitation current of the image shift deflector 104 is controlled by the system control unit 114 to be off. The excitation current of the scanning deflector 105 is controlled by the system control unit 114 so as to shift the primary beam 102 for scanning on the sample 107.

A negative voltage is applied to the sample 107 by a retarding voltage source 108, and thus, the primary beam 102 is radiated onto the sample 107 after decelerating. In this example, the retarding voltage source 108 applies a negative voltage to the sample 107, but there is no limit on the applied voltage, which may be 0 kV. The primary beam 102 radiated onto the sample 107 interacts with substances near the surface, causing secondary electrons or backscattered electrons to be generated according to the shape and material of the sample. In the present embodiment, such electrons are collectively referred to as secondary electrons.

A negative voltage is applied to the sample 107 by the retarding voltage source 108, and thus, secondary electrons generated from the position 122A become secondary beam 109 that return along the trajectory of the primary beam 102 while being accelerated. The secondary beam 109 passes through the objective lens 106, the scanning deflector 105, and the image shift deflector 104, after which it enters the magnetic sector 103 through the entrance/exit 120B of the magnetic sector 103.

The excitation current of the magnetic sector 103 is controlled by the system control unit 114 such that the secondary beam 109 that has entered is deflected by 30 degrees. The primary beam 102 and the secondary beam 109 move in opposite directions, and thus, the directions of deflection of the primary beam 102 and the secondary beam 109 caused by the magnetic sector 103 are also opposite to each other. Thus, the primary beam 102 and the secondary beam 109 are separated in the magnetic sector 103.

The secondary beam 109 passes through the secondary beam correction mechanism 110 inside the magnetic sector 103, after which it exits the magnetic sector 103 through the entrance/exit 120C of the magnetic sector. The secondary beam correction mechanism 110 is controlled by the system control unit 114 to be off. The secondary beam 109 exiting the magnetic sector 103 enters the secondary electron information separator 111 at a position 121A at the entrance of the secondary electron information separator 111.

The secondary electron information separator 111 allows through, as a secondary beam 112, only electrons within the secondary beam 109 that have a specific energy or a specific emission angle when emitted from the sample 107, for example.

The detector 113 detects the secondary beam 112 exiting the secondary electron information separator 111 and converts the secondary beam 112 into a detection signal. The value of the detection signal changes according to the irradiation position of the primary beam 102. The system control unit 114 converts the value of the detection signal at the irradiation position into brightness of a pixel to generate an SEM image. The user terminal 115 displays the generated SEM image.

Figure 2:
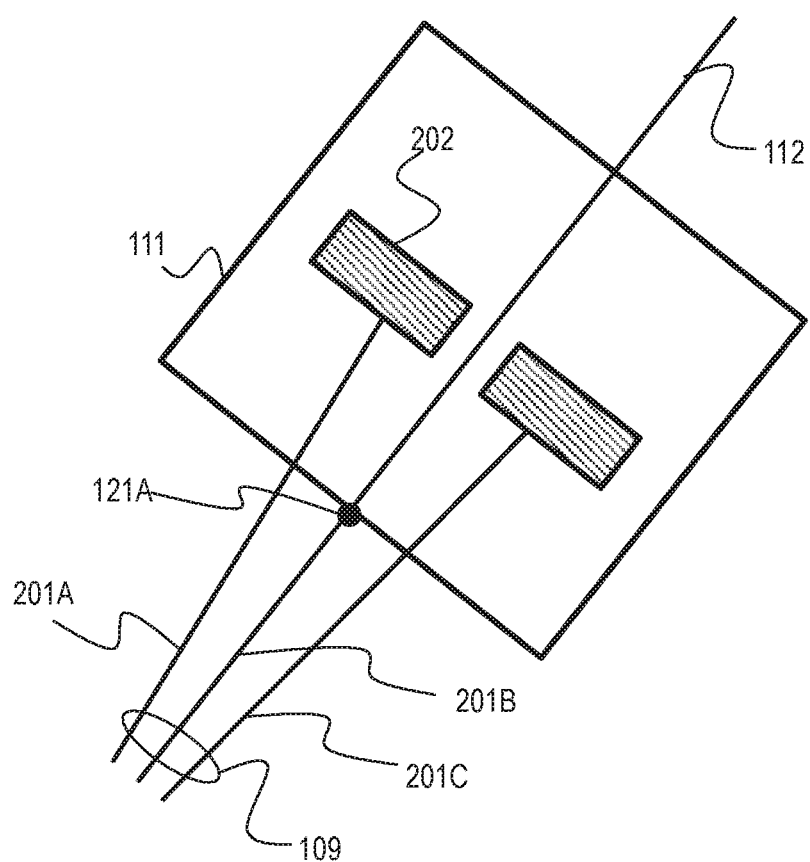
FIG. 2 is a diagram showing a secondary electron information separator of the electron beam observation device according to Embodiment 1.

Next, a configuration example of the secondary electron information separator 111 according to the present embodiment will be described with reference to FIG. 2. FIG. 2 shows the secondary electron information separator 111 and the vicinity thereof. The secondary beam 109 has an emission angle distribution when emitted from the sample 107 and enters the entrance of the secondary electron information separator 111 with a distribution according to the emission angle distribution.

A secondary beam 201B corresponds to secondary electrons emitted directly upwards from the sample 107 (emission angle of approximately 0 degrees). An entry position 121A is where the secondary beam 201B within the distribution of secondary beam 109 enters.

Secondary beams 201A and 201C correspond to secondary electrons emitted at an emission angle greater than or equal to a specific angle. Among the secondary beams 201A, 201B, and 201C, the secondary beams 201A and 201C are blocked by an aperture 202. Only the secondary beam 201B having an emission angle of approximately 0 degrees passes through the secondary electron information separator 111 and is emitted as the secondary beam 112.

In this manner, the secondary electron information separator 111 has the function of selecting the central portion of the secondary beam 109 and allowing it through as the secondary beam 112. Here, a secondary electron information separator 111 that selectively allows through the secondary beam 201B having an emission angle of 0 degrees from the sample 107 from among the secondary beam 109 was described, but a secondary electron information separator 111 having another configuration can be used.

For example, the secondary electron information separator 111 may select the emission angle of the secondary beam 109 to be allowed to pass through by changing the positional relationship between the aperture 202 and the secondary beam. The secondary electron information separator 111 changes the opening position of the aperture 202 or deflects the secondary beam to control the relative positions of the aperture 202 and the secondary beam, for example.

Besides this, an energy filter or a spectrometer may be used as the secondary electron information separator 111. Such a secondary electron information separator 111 selects only a secondary beam 109 having a specific energy by applying a negative voltage to the electrode. In this manner, the secondary electron information separator 111 can select only a secondary beam having specific secondary electron information.

In the example shown in FIG. 1, the secondary electron information separator 111 and the detector 113 are independent devices but may be configured into a same device. In other words, the detector 113 may have a secondary electron information separation function.

Next, the method for acquiring an SEM image in a case in which the image shift function is turned on, that is, in which the image shift deflector 104 is turned on, will be described with reference to FIG. 1. Below, portions that differ from when the image shift deflector 104 is turned off will be primarily described.

Similar to when the image shift deflector 104 is turned off, the primary beam 102 enters the magnetic sector 103 through the entrance/exit 120B and passes through the image shift deflector 104. The excitation current of the magnetic sector 104 is controlled by the system control unit 114 such that the primary beam 102 is deflected to become the primary beam 116.

The relationship between the image shift amount and the deflection amount (excitation current and current value therefor) is set in advance according to the required image shift amount. The image shift amount is a vector amount having a direction and magnitude.

The primary beam 116 passes through the scanning deflector 105 and the objective lens 106, after which it is focused onto a position 122B on the sample 107. Similar to the case in which the image shift deflector 104 is off, the excitation current of the scanning deflector 105 is controlled by the system control unit 114 so as to scan the primary beam 116 on the sample 107. Also, a negative voltage is applied to the sample 107 by a retarding voltage source 108, and thus, the primary beam 116 is radiated onto the sample 107 after decelerating.

Secondary electrons generated from the position 122B form a secondary beam 117 accelerated by the negative voltage from the retarding voltage source 108. The secondary beam 117 passes through the objective lens 106, the scanning deflector 105, and the image shift deflector 104 at a different trajectory from the secondary beam 109 generated when the image shift deflector 104 is off, after which it enters the magnetic sector 103 through the entrance/exit 120B.

The secondary beam 117 is deflected by the magnetic field inside the magnetic sector 103 and the trajectory thereof is separated to a great degree from the trajectory of the primary beam 102. When the secondary beam 117 passes through the secondary beam correction mechanism 110 inside the magnetic sector 103, it is deflected at the position 118. The structure of the secondary beam correction mechanism 110 will be described later.

The secondary beam 117 exits through the entrance/exit 120C of the magnetic sector 103 and enters the secondary electron information separator 111 at a position 121B at the entrance thereof. In the secondary beam correction mechanism 110, the entry position 121B of the secondary beam 117 into the secondary electron information separator 111 is controlled by the system control unit 114 so as to approach the entry position 121A for when the image shift deflector 104 is off. In this example, the secondary beam correction mechanism 110 deflects the secondary beam 117 such that the entry position 121B matches the entry position 121A.

Thus, when the image shift deflector 104 is on, the secondary beam correction mechanism 110 deflects the secondary beam 117 such that the value of the specific entry condition of the secondary beam 117 into the secondary electron information separator 111 approaches the value of the entry condition for when the image shift deflector 104 is off. The deflection amount (correction amount) by the secondary beam correction mechanism 110 is a vector amount which depends on the deflection amount (image shift amount) by the image shift deflector 104.

When the image shift deflector 104 is on, the secondary beam correction mechanism 110 may deflect the secondary beam 117 such that the value of an entry condition other than the entry position into the secondary electron information separator 111 approaches the value of the entry condition for when the image shift deflector 104 is off. For example, when the image shift deflector 104 is on, the secondary beam correction mechanism 110 may deflect the secondary beam 117 such that the entry angle into the secondary electron information separator 111 approaches the entry angle for when the image shift deflector 104 is on.

By controlling the secondary beam correction mechanism 110 such that there is only a small difference in entry conditions of the secondary beams into the secondary electron information separator 111, according to whether the image shift deflector 104 is on or off, it is possible to reduce negative effects of the image shift on information separation.

The secondary beam correction mechanism 110 is formed inside the magnetic sector 103, and thus, the trajectory of the secondary beam changed by the image shift is corrected in the magnetic sector 103, and it is possible to effectively prevent the secondary beam from colliding with the magnetic sector 103. Also, it is possible to improve the flexibility in designing the secondary electron information separator 111.

In the present embodiment, the primary beam and the secondary beam are separated by a large angle by the magnetic sector 103, and the secondary beam correction mechanism 110 is placed at a position off the trajectory of the primary beam. In this manner, the secondary beam correction mechanism 110 is prevented from affecting the primary beam, and the secondary beam correction mechanism 110 can be designed without needing to take such an effect into consideration.

In FIG. 1, the secondary beam correction mechanism 110 deflects the secondary beam 117 once at a virtual deflection position 118. The deflection position 118 is also referred to as a deflection pivot. The deflection pivot is a point where a plurality of emitted beams under differing magnetic field conditions interpolate and intersect. The number of deflection pivots is determined according to the design of the electron beam observation device, and the secondary beam correction mechanism 110 may deflect the secondary beam 117 at a plurality of positions.

If performing deflection within a plane parallel to the opposing magnetic plates, the deflection pivot is a point where a plurality of emitted beams at differing magnetic field intensities interpolate and intersect. The emitted beam appears as though it is traveling in a straight line from the deflection pivot and appears to change direction from the deflection pivot according to the change in magnetic field intensity. If there are a plurality of magnetic field regions, each magnetic field region has a deflection pivot. The deflection pivot for deflection in a direction intersecting with the magnetic plate is present in the vicinity of a fringe magnetic field at the edge of the magnetic field region.

The secondary electron information separator 111 allows through, as the secondary beam 119, only the secondary beam of secondary electrons having specific information within the secondary beam 117. Secondary electrons emitted at a specific energy or a specific emission angle from the sample 107 are selected, for example. By having the entry conditions of the secondary beam 109 and the secondary beam 117 into the secondary electron information separator 111 be similar to each other, it is possible for the secondary beam 112 and the secondary beam 119 passing through the secondary electron information separator 111 to have the same information.

The detector 113 detects the secondary beam 119 passing through the secondary electron information separator 111. Thus, the electron beam observation device uses the system control unit 114 to control the amount of deflection in the secondary beam correction mechanism 110 according to the amount of deflection in the image shift deflector 104, thereby allowing specific secondary electron information to be detected by the detector 113 regardless of the image shift amount.

Next, the configuration of the secondary beam correction mechanism 110 of the present embodiment will be described with reference to FIGS. 3A to 3D. There are two different methods to form secondary beam correction mechanism 110: a method in which the trajectory of secondary beam 117 is corrected using a magnetic field and a method in which the trajectory of secondary beam 117 is corrected using an electric field. A secondary beam correction mechanism 110 that uses a magnetic field can be easily built into the magnetic sector 103. A secondary beam correction mechanism 110 that uses an electric field has the advantage of a fast response speed.

Figure 3A:
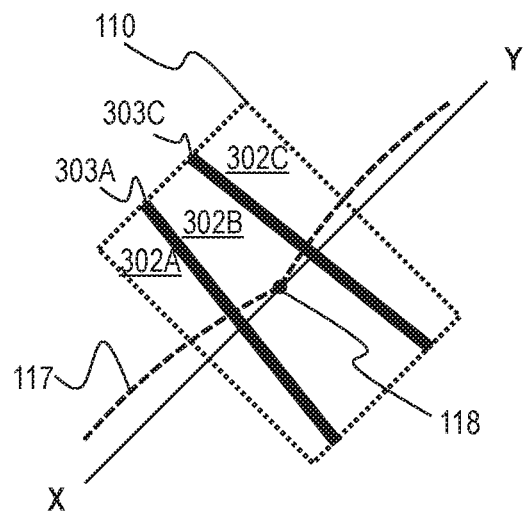
FIG. 3A is a diagram showing a configuration example of secondary beam correction mechanism according to Embodiment 1.
Figure 3B:
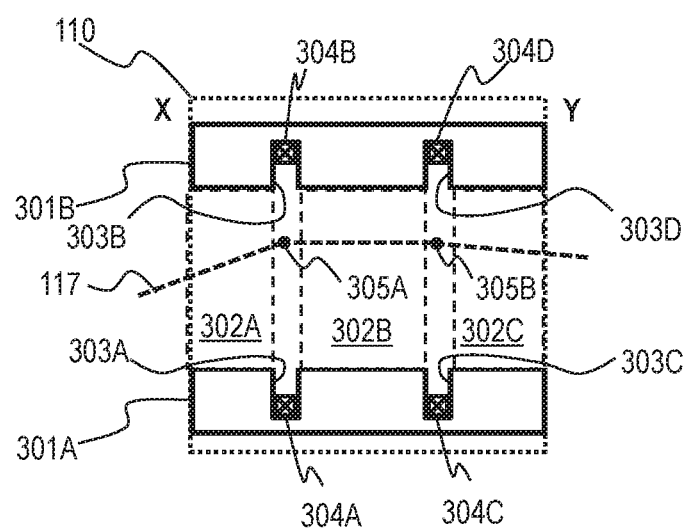
FIG. 3B is a diagram showing the configuration example of secondary beam correction mechanism according to Embodiment 1.
Figure 3C:
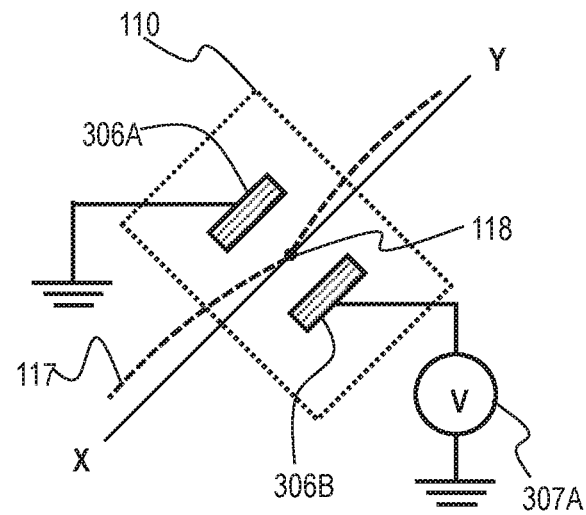
FIG. 3C is a diagram showing a configuration example of secondary beam correction mechanism according to Embodiment 1.
Figure 3D:
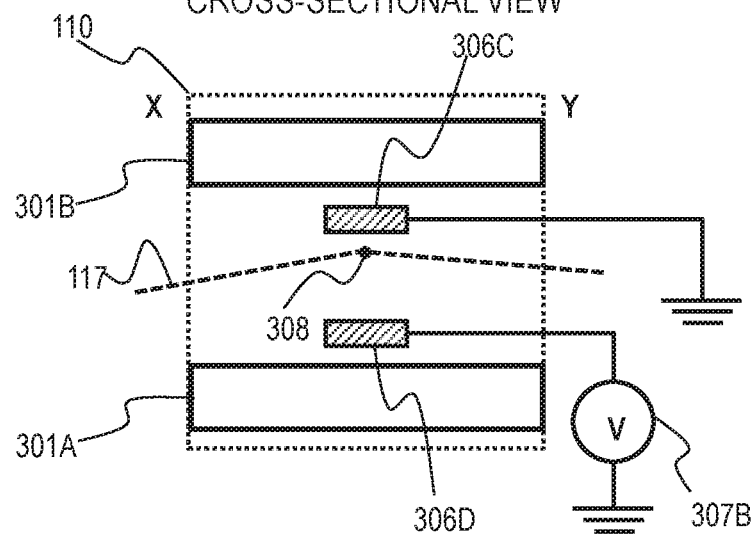
FIG. 3D is a diagram showing the configuration example of secondary beam correction mechanism according to Embodiment 1.

FIGS. 3A and 3B show a secondary beam correction mechanism 110 that corrects the trajectory of the secondary beam 117 using a magnetic field. FIGS. 3C and 3D show a secondary beam correction mechanism 110 that corrects the trajectory of the secondary beam 117 using an electric field.

In the present embodiment, the secondary beam correction mechanism 110 is encompassed within the magnetic sector 103, and thus, FIGS. 3A to 3D show two parallel magnetic plates 301A and 301B that constitute the magnetic sector 103. Below, the respective methods will be explained in succession.

First, the method in which the secondary beam 117 is corrected using a magnetic field will be described. FIG. 3A shows a front view of the vicinity of the position 118 in the magnetic sector 103 as seen from the front of the page, and FIG. 3B shows a cross-sectional view of FIG. 3A along the line XY.

The secondary beam correction mechanism 110 is formed as a portion of the magnetic sector 103, and a portion of the parallel magnetic plates 301A and 301B are parallel magnetic plate sections of the secondary beam correction mechanism 110. The secondary beam correction mechanism 110 includes two pairs of grooves formed in the parallel magnetic plates 301A and 301B, and specifically includes a pair of grooves 303A and 303B and a pair of grooves 303C and 303D.

The grooves 303A and 303C are formed on the surface of the magnetic plate 301A facing the magnetic plate 301B. The grooves 303B and 303D are formed on the surface of the magnetic plate 301B facing the magnetic plate 301A. The opposing surfaces of the magnetic plates 301A and 301B are parallel to each other. The grooves 303A and 303B oppose each other and are parallel to each other when projected onto a plane parallel to the magnetic plates 301A and 301B. The grooves 303C and 303D oppose each other and are parallel to each other when projected onto a plane parallel to the magnetic plates 301A and 301B.

The grooves 303A to 303D form three regions 302A, 302B, and 302C in a space within the secondary beam correction mechanism 110 between the magnetic plates 301A and 301B. The region 302A is the region between the edge of the secondary beam correction mechanism 110 and the groove 303A, the region 302B is the region between the groove 303A and the groove 303B, and the region 302C is the region between the groove 303C and the edge of the secondary beam correction mechanism 110.

As shown in FIG. 3B, the grooves 303A to 303D have coils 304A to 304D embedded for generating a magnetic field between the magnetic plate 301A and the magnetic plate 301B. FIG. 3B shows a portion of each of the coils 304A to 304D, for example. One coil may include portions 304A and 304C with another coil including portions 304B and 304D. The coils 304A to 304D generate a magnetic field in a direction perpendicular to the magnetic plate 301A in the three regions 302A, 302B, and 302C, and this magnetic field deflects the secondary beam 117 in a direction parallel to the surfaces of the magnetic plates 301A and 301B (in-plane direction).

Thus, as shown in FIG. 3A, the secondary beam correction mechanism 110 (system control unit 114) can control the intensity (including direction) of the excitation current in the coils 304A to 304D, maintain the magnetic field of the regions 301A and 301C, and adjust only the magnetic field (intensity) of the region 302B, thereby being able to deflect the secondary beam 117 at the deflection pivot 118 in a direction parallel to the opposing surfaces of the magnetic plates 301A and 301B. As described above, the deflection pivot is a virtual point, and the secondary beam 117 continuously changes direction in the secondary beam correction mechanism 110 in a direction parallel to the opposing surfaces of the magnetic plates 301A and 301B.

The secondary beam correction mechanism 110 (system control unit 114) can change the shape of the fringe magnetic field generated between the regions 302A and 302B by changing the ratio of excitation currents between the coils 304A and 304B. The direction of the fringe magnetic field has a component parallel to the opposing surfaces of the magnetic plates 301A and 301B. Thus, the secondary beam 117 is deflected in a direction perpendicular to the opposing surfaces of the magnetic plates 301A and 301B.

Therefore, as shown in FIG. 3B, the secondary beam correction mechanism 110 (system control unit 114) can control the ratio of the excitation currents in the coils 304A and 304B, and adjust the shape of the fringe magnetic field generated between the regions 302A and 302B, thereby being able to deflect the secondary beam 117 at a deflection pivot 305A in a direction perpendicular to the opposing surfaces of the magnetic plates 301A and 301B.

Similarly, the secondary beam correction mechanism 110 (system control unit 114) can control the ratio of the excitation currents in the coils 304C and 304D, and adjust the shape of the fringe magnetic field generated between the regions 302B and 302C, thereby being able to deflect the secondary beam 117 at a deflection pivot 305B in a direction perpendicular to the opposing surfaces of the magnetic plates 301A and 301B.

In other words, the secondary beam correction mechanism 110 (system control unit 114) can control the intensity (including direction) of the excitation current as well as the ratio of the excitation currents in the coils 304A to 304D, thereby being able to deflect the secondary beam 117 in directions parallel and perpendicular to the opposing surfaces of the magnetic plates 301A and 301B. In the present embodiment, the secondary beam correction mechanism 110 has two pairs of grooves, but there may be one pair or three or more pairs of grooves.

Next, the method in which the trajectory of the secondary beam 117 is corrected using an electric field will be described. FIG. 3C shows a front view of the vicinity of the position 118 in the magnetic sector 103 as seen from the front of the page, and FIG. 3D shows a cross-sectional view of FIG. 3C along the line XY.

Four electrodes 306A to 306D are placed between the magnetic plates 301A and 301B. An insulator is present between the electrodes 306A to 306D and the magnetic plates 301A and 301B. The electrode 306A and the electrode 306B oppose each other in a direction parallel to the opposing surfaces of the magnetic plates 301A and 301B. The electrode 306C and the electrode 306D oppose each other in a direction perpendicular to the opposing surfaces of the magnetic plates 301A and 301B.

The electrode 306A is grounded. A deflection voltage source 307A applies a deflection voltage to the electrode 306B, causing an electric field to be generated between the electrodes 306A and 306B. The secondary beam correction mechanism 110 (system control unit 114) can control the applied voltage from the deflection voltage source 307A to deflect the secondary beam 117 at a deflection pivot 118 in a direction parallel to the opposing surfaces of the magnetic plates 301A and 301B.

The electrode 306C is grounded. A deflection voltage source 307B applies a deflection voltage to the electrode 306D, causing an electric field to be generated between the electrodes 306C and 306D. The secondary beam correction mechanism 110 (system control unit 114) can control the applied voltage from the deflection voltage source 307B to deflect the secondary beam 117 at a deflection pivot 308 in a direction perpendicular to the opposing surfaces of the magnetic plates 301A and 301B.

That is, by controlling the applied voltage from the deflection voltage sources 307A and 307B, it is possible to deflect the secondary beam 117 in a direction perpendicular or parallel to the opposing surfaces of the magnetic plates 301A and 301B. In the present embodiment, the electrodes 306A and 306B are grounded, but a voltage may be applied thereto.

The secondary beam correction mechanism 110 uses a magnetic field or an electric field, but both a magnetic field and an electric field may be used in combination. In the above example, the magnetic sector 103 is used in which the deflection angle of both the primary beam 102 and the secondary beam 109 is 30 degrees. In the present disclosure, the deflection angle of the beams in the magnetic sector is the angle between the trajectory (direction) of the beam as it enters the magnetic sector 103 and the trajectory (direction) of the beam as it exits the magnetic sector 103.

The shape, size, magnetic field intensity, and the like of the magnetic sector 103 are determined according to the design of the electron beam observation device. The deflection angles of the primary beam and the secondary beam are also determined according to the design of the electron beam observation device. An appropriate value from 0 degrees to 170 degrees can be selected for the deflection angle of the primary beam. An example in which the deflection angle of the primary beam is 0 degrees will be described in Embodiment 2. An appropriate value from 5 degrees to 170 degrees can be selected for the deflection angle of the secondary beam.

The primary beam and the secondary beam may have the same deflection angle or differing deflection angles. The magnetic sector 103 can deflect the primary beam 102 and the secondary beam 117 at differing angles by performing asymmetrical excitation or excitation in an asymmetrical shape on the trajectory of the primary beam and the trajectory of the secondary beam.

Next, a method for setting conditions of the secondary beam correction mechanism 110 will be described. The setting conditions for the secondary beam correction mechanism 110 are determined such that if the detector 113 detects the secondary beam 119 from the same object, the detected secondary beam 119 is not affected by the image shift amount. In the present embodiment, a calibration sample is used in order to determine correction conditions for the secondary beam. The conditions to be set are the same for different samples and are not dependent on the samples after the correction conditions are set.

Figure 4:
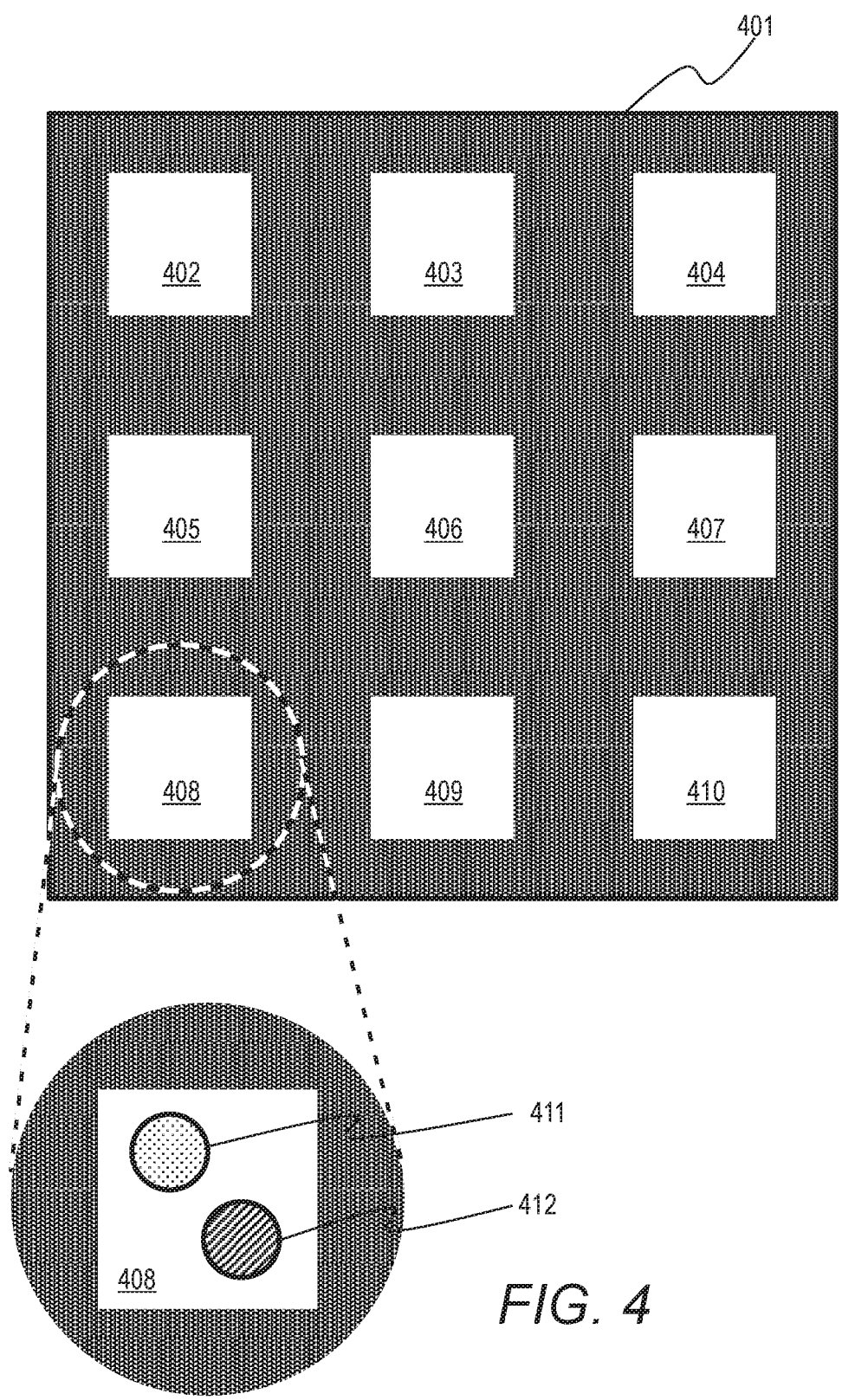
FIG. 4 is a diagram showing an example of a calibration sample for setting the conditions of a secondary beam correction mechanism according to Embodiment 1.

FIG. 4 shows an example of a calibration sample 401. The shown calibration sample 401 includes unit cells 402 to 410 that are arranged periodically in two dimensions, or in other words, arranged periodically on a plane in the vertical direction and the horizontal direction. The unit cells are placed at a constant interval in the vertical direction and the horizontal direction. The unit cells 402 to 410 have a size that fits within the field of view of an SEM image and all of the unit cells 402 to 410 have the same shape (pattern).

As shown in the magnified view of the unit cell 408, each unit cell includes a three-dimensional structure 411 and a sample palette 412 in which various materials are arranged. In this manner, more accurate correction of the secondary beam trajectory containing the emission angle and energy information of the secondary electrons can be attained. By using the calibration sample 401, it is possible to set conditions for the secondary beam correction mechanism 110 quickly and accurately.

Figure 5:
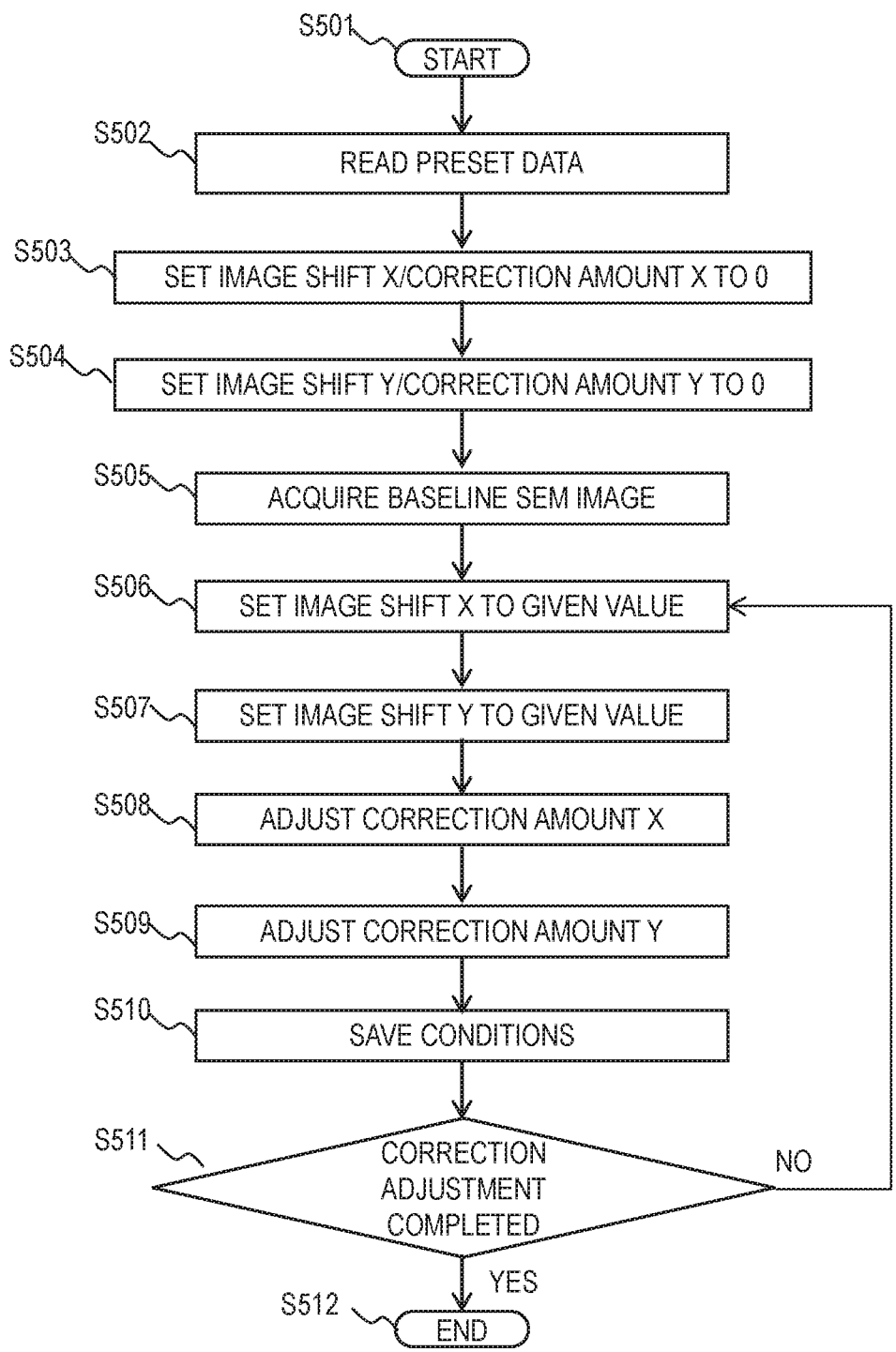
FIG. 5 is a flowchart for setting the conditions of a secondary beam correction mechanism according to Embodiment 1.
Figure 6:
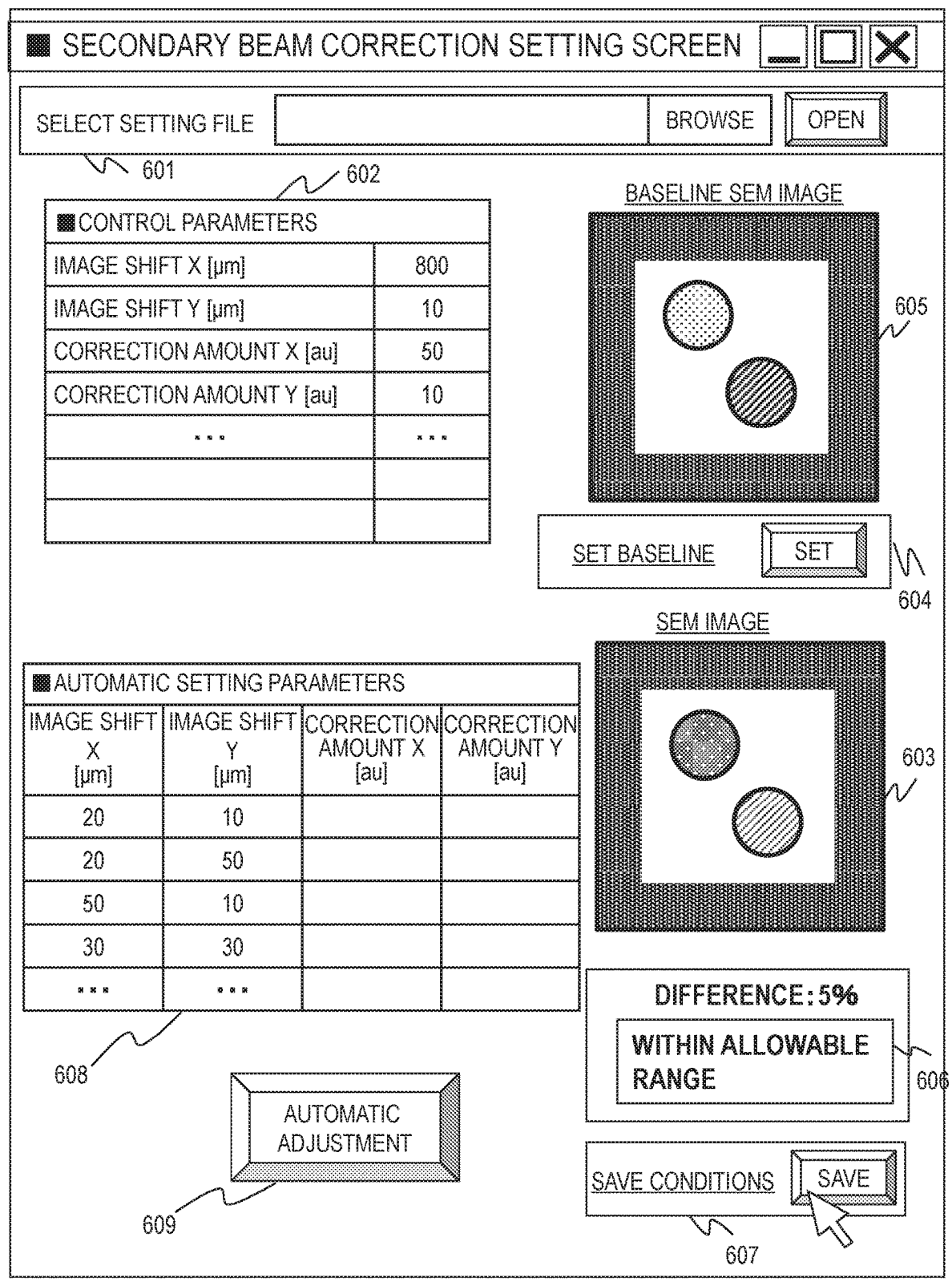
FIG. 6 is a secondary beam correction setting screen for a secondary beam correction mechanism according to Embodiment 1.

The method for setting control information (setting conditions) of the secondary beam correction mechanism 110 in the present embodiment will be described with reference to the flowchart shown in FIG. 5 and the secondary beam correction setting screen shown in FIG. 6. When the user starts setting conditions for correcting the secondary beam through the user terminal 115 shown in FIG. 1, the user terminal 115 displays the secondary beam correction setting screen on the display screen of the display device (S501).

When referring to already saved control parameters, the operator selects a preset data file name in a setting file selection frame 601 and reads preset data (S502). The user terminal 115 reads preset data from a storage device and displays it in the display device.

Next, the operator sets, in the image shift X and image shift Y input fields, a value of 0 as a reference image shift amount in order to control the image shift deflector 104 in the control parameter frame 602 (S504). The operator observes the unit cell 406 of the calibration sample 401 using an SEM in such a state where image shifting is off.

The user terminal 115 receives the setting of the image shift amount from the operator and sends data indicating the image shift amount to the system control unit 114. The system control unit 114 controls each element according to the image shift amount transmitted from the user terminal 115, acquires an SEM image of the unit cell 406, and transmits the image to the user terminal 115.

The user terminal 115 displays the acquired SEM image in an SEM image frame 603. When the operator sets a baseline setting frame 604, the user terminal 115 defines this SEM image as a baseline SEM image (reference image) and displays the image in a baseline SEM image frame 605 (S505). Depending on the design, the baseline SEM image may be an image with an image shift amount (reference image shift amount) other than 0.

Next, the operator applies given image shift amounts X and Y using the control parameter frame 602 (S506, S507) and observes any of the unit cells 402 to 410 of the calibration sample. As described above, the user terminal 115 transmits to the system control unit 114 data indicating the inputted image shift amount, and the system control unit 114 transmits the captured SEM image with the aforementioned image shift amounts to the user terminal 115.

The user terminal 115 displays the SEM image for which image shifting was performed in the SEM image frame 603. If the secondary electron information detected by the detector 113 changes according to the image shift amount, the images shown in the SEM image frame 603 and the baseline SEM image frame 605 would have differing signal amounts.

The operator adjusts the correction amounts (deflection amounts) in the control parameter frame 602 such that the two SEM images are the same (S508, S509). The correction amounts are vector quantities expressed as a correction amount X and a correction amount Y. The correction amounts correspond to signals provided to the secondary beam correction mechanism 110, and specifically, the excitation current to each of the coils and/or the voltage of each of the two electrode pairs.

The difference between the two SEM images is displayed in a difference frame 606, and if the difference is 5% or less, "within allowable range" is displayed. Display of "within allowable range" indicates that the detected secondary electron information match each other for the purposes of the device and user, and the entry conditions of the secondary beam to the secondary electron information separator 111 are the same from the perspective of the device and the user.

The operator repeatedly acquires SEM images with differing pairs of correction amounts X and correction amounts Y until the difference frame 606 displays "within allowable range". When the difference frame 606 displays "within allowable range", the operator stops adjustment and saves the setting conditions using a condition saving frame 607 (S510). The setting conditions indicate the image shift amount X and image shift amount Y, and the correction amount X and correction amount Y. The setting conditions are saved in storage devices of the user terminal 115 and the system control unit 114.

The settings of the secondary beam correction mechanism 110 depend on the image shift amount. Thus, if setting of conditions of the secondary beam correction mechanism 110 is to be performed with two or more image shift conditions (image shift amounts) (S511), then the operator repeats steps S506 to S510 with differing image shift amounts. When correction adjustment is completed, the operator ends condition setting for secondary beam correction (S512).

The user terminal 115 may automatically perform steps S503 to S512. The operator inputs all image shift conditions (image shift amounts) for adjustment in an automatic adjustment parameter frame 608 and clicks on an automatic adjustment button 609. The user terminal 115 determines appropriate conditions for the secondary beam correction mechanism 110 for each of the image shift conditions and saves such conditions.

The user terminal 115 determines appropriate conditions for the secondary beam correction mechanism 110 using a well-known algorithm. For example, the user terminal 115 determines the correction conditions (correction amount X, correction amount Y) for this round such that an SEM image under the correction conditions for this round has a smaller difference from the SEM image with an image shift amount of 0 than the difference between the SEM image with an image shift amount of 0 and an SEM image under previous correction conditions (correction amount X, correction amount Y).

The user terminal 115 sequentially selects correction conditions (correction amount X, correction amount Y) that would reduce the difference, thereby enabling correction conditions (correction amount X, correction amount Y) where the difference is within the allowable range. The user terminal 115 performs measurement under differing correction conditions as necessary to determine the current correction conditions.

The sample used for setting the conditions of the secondary beam correction mechanism 110 may be a single unit cell (only unit cell 408, for example) instead of a repeating two-dimensional pattern such as the calibration sample 401.

In this case, the system control unit 114 uses the sample conveyance stage 123 according to the image shift amount and moves the unit cell 408 to an irradiation position 122B of the primary beam 102 and observes the unit cell. The relationship between the image shift amount and the movement amount of the sample conveyance stage 123 is set in advance. By moving the unit cell 408 using the sample conveyance stage 123, the need to prepare a special adjustment sample is eliminated.

Figure 7:
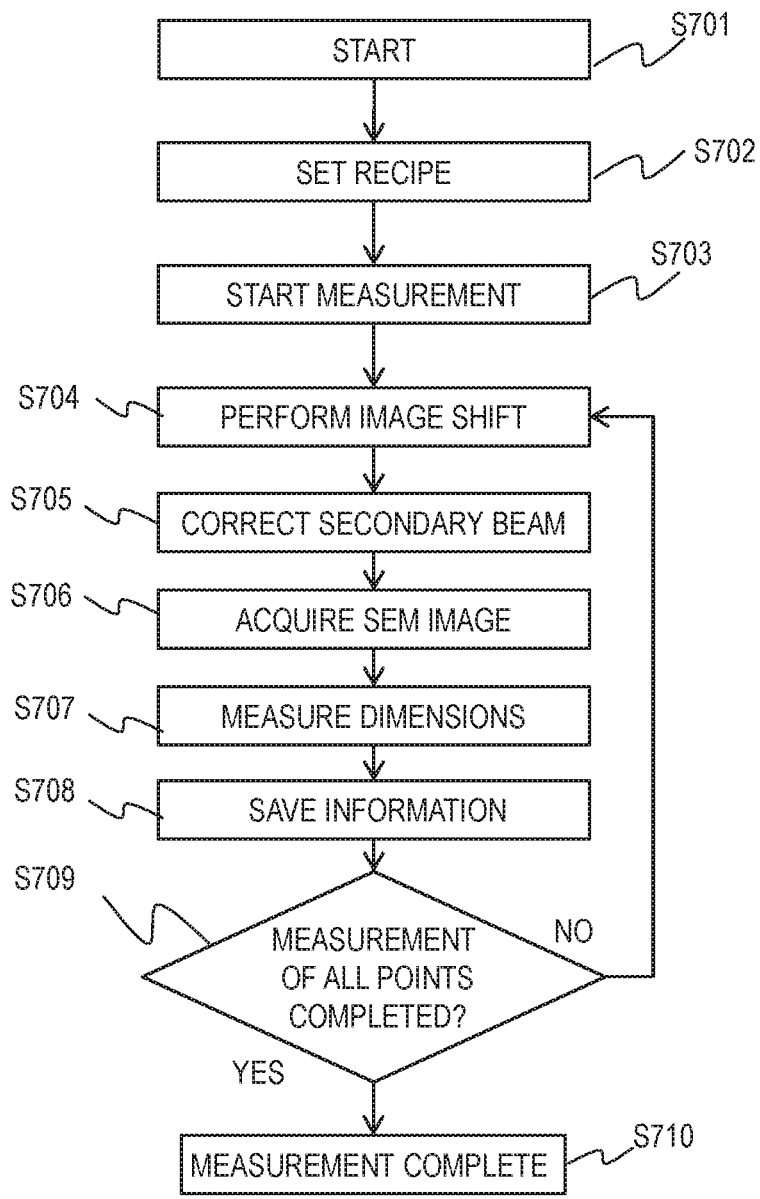
FIG. 7 is a flowchart for dimension measuring according to Embodiment 1.

Next, the method for measuring the dimensions of a semiconductor device using an SEM image acquired by the configuration of the present embodiment will be described with reference to the flowchart shown in FIG. 7. The operator opens an image (not shown) for performing a measurement through the user terminal 115 and starts the process of the flowchart (S701).

The operator sets and records, through the user terminal 115, a recipe including all conditions necessary for measurement such as the arrangement of chips inside the sample to be measured, as well as the coordinates, approximate dimensions, materials, number of chips, and the like for the chips inside the device to be measured (S702). The system control unit 114 conveys the sample using the sample conveyance stage 123 and starts measurement according to the recipe transmitted from the user terminal 115 (S703).

The system control unit 114 performs image shifting in which the primary beam 102 is radiated onto coordinates according to the recipe by controlling the image shift deflector 104 (S704). The system control unit 114 causes the trajectory of a secondary beam to be corrected, in response to the image shifting, under conditions saved in advance in the secondary beam correction setting screen of FIG. 6 (S705).

The relationship between the image shift amount and the correction amount is set in advance, as described above. The correction amount for the secondary beam corresponds to signals (current and voltage) provided to the secondary beam correction mechanism 110. The system control unit 114 uses a value measured during the setting process described with reference to FIG. 6 and a function (such as linear interpolation) to determine the correction amount corresponding to a given image shift amount.

The system control unit 114 acquires an SEM image (S706), measures the dimensions of the semiconductor device (S707), and stores the measured lengths (S708). The system control unit 114 determines whether all points indicated in the recipe have been measured (S709) and then repeatedly executes steps S704 to S708 until measurement of all points is completed (S709: NO). The system control unit 114 measures all points (S709: YES), and then completes measurement (S710).

As described above, according to the present embodiment, it is possible to achieve information separation for secondary electrons that is not affected by image shifting in an electron beam observation device equipped with a magnetic sector.

Embodiment 2

In Embodiment 1, the magnetic sector 103 deflected both the primary beam 102 and the secondary beam 109 to separate the primary beam 102 from the secondary beam 109. In this configuration, in order to radiate the primary beam 102 perpendicularly to the sample 107, it is necessary to have the optical system above the magnetic sector 103 at an angle with respect to the optical system below the magnetic sector 103.

The diagonally placed optical system above the magnetic sector 103 is a cause for vibration of primary beam 102 that can reduce the resolution of the SEM images. Thus, it is preferable that the optical system above the magnetic sector 103 and the optical system below the magnetic sector 103 be arranged in a straight line. The present embodiment describes an electron beam observation device that can separate secondary electron information without being affected by image shifting, using a magnetic sector that only deflects the secondary beam 109 at a large angle.

Figure 8:
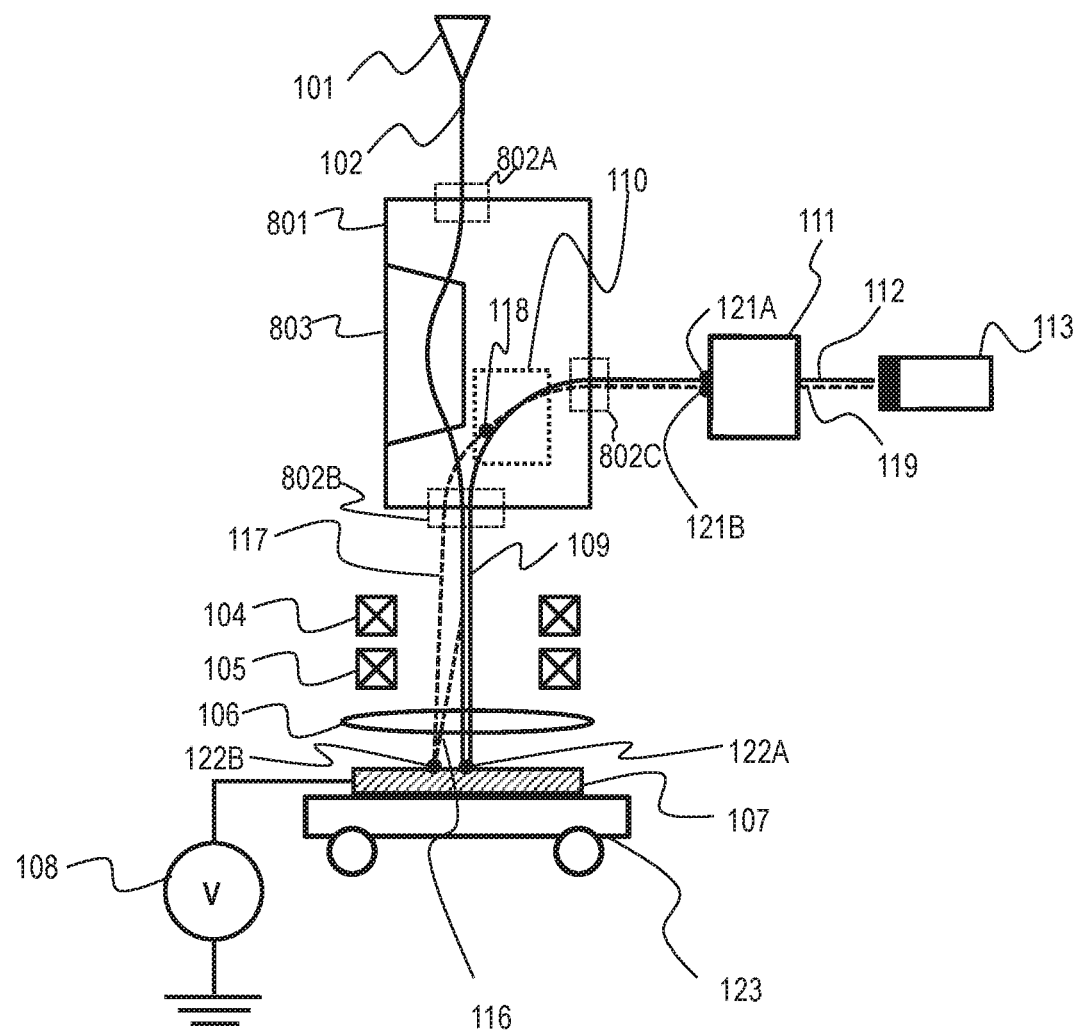
FIG. 8 is a diagram showing a schematic configuration of an electron beam observation device according to Embodiment 2.

FIG. 8 shows a schematic configuration of an electron beam observation device according to the present embodiment. The configuration of the device is similar to that of Embodiment 1 aside from the magnetic sector 801, and the method for setting correction conditions and performing control of the secondary beam correction mechanism 110 is also similar to that of Embodiment 1. Below, the trajectories of the primary beam 102 and the secondary beam 109 within the magnetic sector 801, which differs from Embodiment 1, will be primarily described.

First, the trajectory of the primary beam 102 will be described. The primary beam 102 enters the magnetic sector 801 through an entrance/exit 802A. The magnetic sector 801 has a region 803. The magnetic field generated in the region 803 is opposite in direction to the magnetic field within the magnetic sector 801 in areas surrounding the region 803. Thus, the directions that the primary beam 102 is deflected are in opposite directions between the magnetic sector 801 and the region 803 therein.

The primary beam 102 is deflected by the magnetic sector 801 and by the region 803 therein, and exits the magnetic sector 801 through an entrance/exit 802B. By controlling the magnetic field intensity of the region 803 inside the magnetic sector, the (trajectory of the) primary beam 102 towards the sample 107 is the same both prior to entry into and after exiting the magnetic sector 801.

Next, the secondary beam 109 inside the magnetic sector 801 will be described. The secondary beam 109 enters the magnetic sector 801 through the entrance/exit 802B. The secondary beam 109 passes through the secondary beam correction mechanism 110 after being separated from the primary beam 102 by the magnetic sector 801, and then exits the magnetic sector 801 through the entrance/exit 802C after having been deflected by 90 degrees.

In the present embodiment, the secondary beam 109 is deflected by 90 degrees in the magnetic sector 801, but the deflection angle of the secondary beam 109 may be any angle from 5 to 170 degrees. As described above, according to the present embodiment, it is possible to achieve information separation for secondary electrons that is not affected by image shifting in an electron beam observation device in which optical systems both above and below the magnetic sector in relation to the primary beam are placed along a straight line. A portion of the configuration of the present embodiment such as the settings for the control information (setting of conditions) of the secondary beam correction mechanism 110 can be applied to charged particle beam devices that do not include magnetic sectors.

Embodiment 3

In Embodiments 1 and 2, descriptions were made with primary focus on the separation of the primary beam 102 from the secondary beam 109. A mirror aberration corrector that corrects for aberrations in the primary beam 102 caused by the optical element using a magnetic sector and a mirror to achieve a higher resolution SEM image is known as one type of electron beam observation device that uses a magnetic sector.

The present embodiment achieves a high resolution electron beam observation device that can separate secondary electron information with a high accuracy by the using a mirror aberration corrector with the magnetic sector that can separate secondary electron information without being affected by image shifting.

Figure 9:
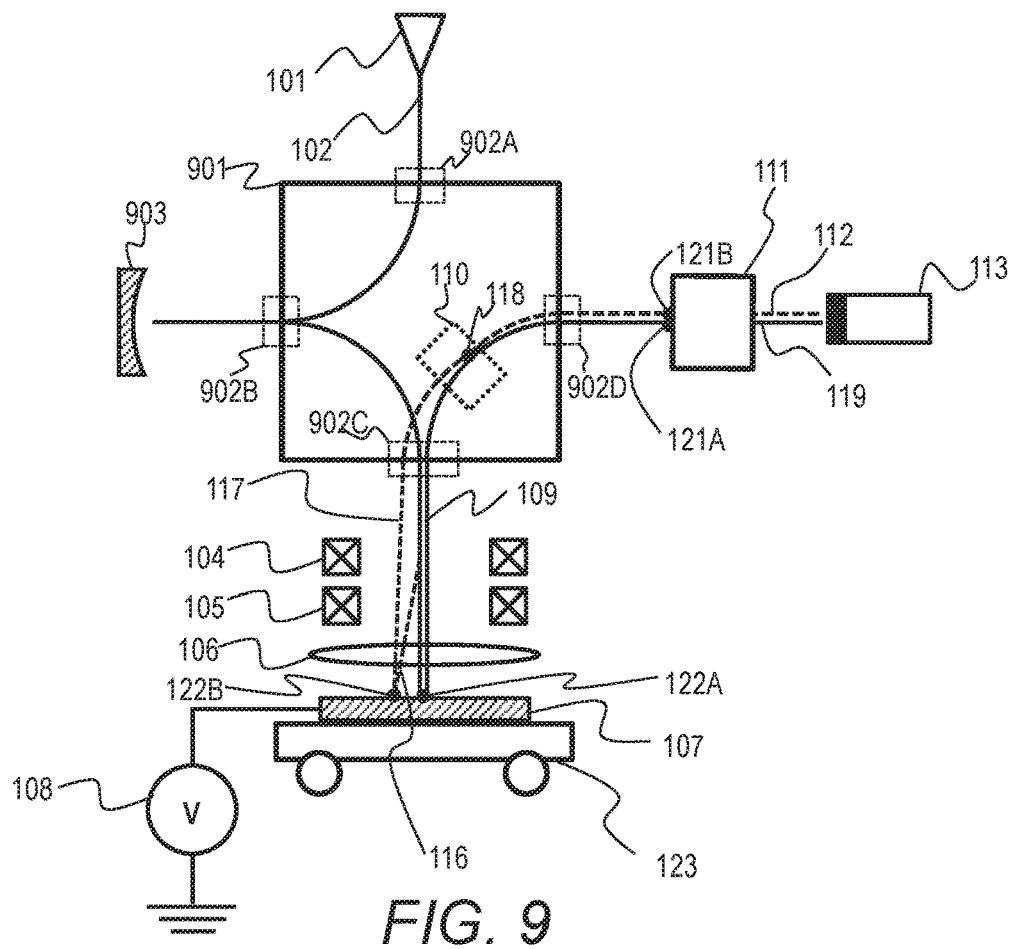
FIG. 9 is a diagram showing a schematic configuration of an electron beam observation device according to Embodiment 3.

FIG. 9 shows a schematic configuration of an electron beam observation device according to the present embodiment. The configuration of the device is similar to that of Embodiment 1 aside from the magnetic sector 901 and the mirror 903, and the method for setting correction conditions and performing control of the secondary beam correction mechanism 110 is also similar to that of Embodiment 1.

Below, the trajectory of the primary beam 102 from an entrance/exit 902A to an entrance/exit 902C in the magnetic sector 901, the optical elements placed on that trajectory, and the trajectory of the secondary beam 109 within the magnetic sector 901, which are the differences between the present embodiment and Embodiment 1, will be primarily described.

The primary beam 102 enters the magnetic sector 901 through the entrance/exit 902A and exits the entrance/exit 902B after being deflected by 90 degrees. Then, after the spherical aberration and color aberration in the primary beam 102 is corrected by the primary beam being reflected by the mirror 903, it passes through the same trajectory in reverse and once again enters the magnetic sector 901 through the entrance/exit 902B. The primary beam 102 is deflected by 90 degrees again by passing through the magnetic sector 901 again, and then exits the magnetic sector 901 through the entrance/exit 902C.

Figure 10:
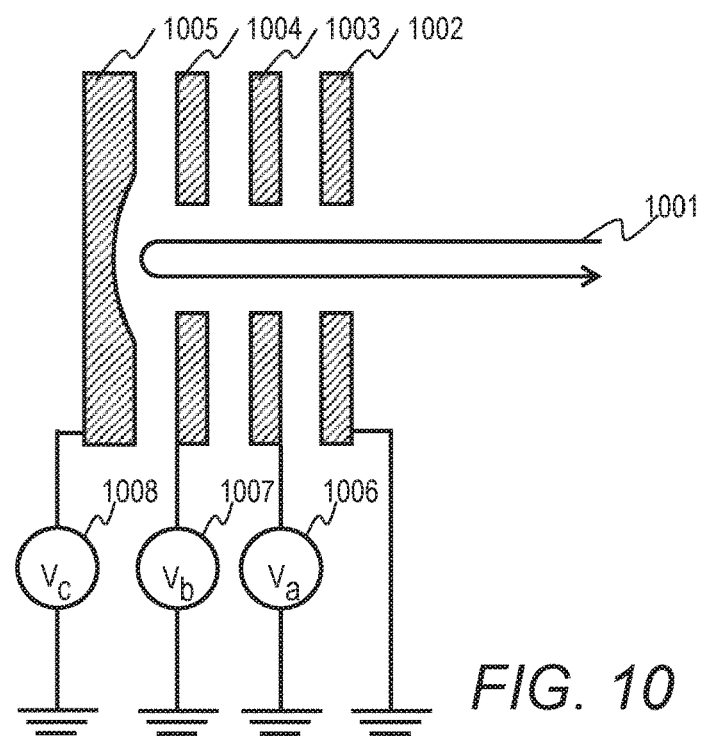
FIG. 10 is a diagram showing a mirror according to Embodiment 3.

The method of aberration compensation by the mirror 903 will be described. FIG. 10 shows details of the mirror 903. The mirror 903 consists of four electrodes 1002, 1003, 1004, and 1005. The electrode 1002 is grounded, and other electrodes are connected to a voltage source 1006, a voltage source 1007, and a voltage source 1008 for application of voltage.

After the electron beam 1001 is radiated onto the mirror 903, it is reflected vertically by the electric field generated by the four electrodes. The electron beam 1001 is reflected when the voltage applied by the voltage source 1008 to the electrode 1005 is a negative potential with an absolute value greater than or equal to the acceleration voltage. If the acceleration voltage is 3 kV, for example, then the voltage source 1008 applies a voltage of −3.2 kV to the electrode 1005. The electrode 1002 is grounded, and the voltages applied to the remaining three electrodes allow for the spherical aberration and color aberration to be corrected.

If the column is not grounded and a voltage is applied to accelerate the primary beam 102, then the same voltage is applied to the electrode 1002. The trajectory of the primary beam 102 from the entrance/exit 902A to the entrance/exit 902C and the optical elements placed on that trajectory were described above.

Next, the secondary beam 109 inside the magnetic sector 901 will be described. The secondary beam 109 enters the magnetic sector 901 through the entrance/exit 902C. The secondary beam 109 passes through the secondary beam correction mechanism 110 after being separated from the primary beam 102 by the magnetic sector 901, and then exits the magnetic sector 901 through the entrance/exit 902D after having been deflected by 90 degrees.

In the present embodiment, the primary beam 102 and the secondary beam 109 are deflected by 90 degrees in the magnetic sector 901, but the respective deflection angles may be any angle from 5 to 170 degrees depending on the design of the magnetic sector 901. By the configuration described above, it is possible to realize mirror aberration correction in an electron beam observation device that performs information separation of secondary electrons that is unaffected by image shifting.

It should be noted that present invention is not limited to the above-described embodiments but include various modifications. For example, the above-described embodiments provide details for the sake of better understanding of present invention; they are not limited to those including all the configurations as described. A part of the configuration of an embodiment may be replaced with a configuration of another embodiment or a configuration of an embodiment may be incorporated to a configuration of another embodiment. A part of the configuration of an embodiment may be added, deleted, or replaced by that of a different configuration.

The above-described configurations, functions, and processing units, for all or a part of them, may be implemented by hardware: for example, by designing an integrated circuit. The above-described configurations and functions may be implemented by software, which means that a processor interprets and executes programs providing the functions. The information of programs, tables, and files to implement the functions may be stored in a storage device such as a memory, a hard disk drive, or an SSD (Solid State Drive), or a storage medium such as an IC card or an SD card.

The drawings show control lines and information lines as considered necessary for explanations but do not show all control lines or information lines in the products. It can be considered that most of all components are actually interconnected.

What is claimed is:

1. A charged particle beam device that detects a secondary charged particle beam generated by irradiation of a sample by a primary charged particle beam, the charged particle beam device comprising:
   an image shift deflector that shifts an irradiation region for irradiation of the sample by the primary charged particle beam;
   a magnetic sector that separates the primary charged particle beam passing therein from the secondary charged particle beam from the sample using a magnetic field generated therein;
   a correction mechanism that is placed off of the trajectory of the primary charged particle beam but on the trajectory of the secondary charged particle beam inside the magnetic sector, the correction mechanism deflecting the secondary charged particle beam passing through; and
   a controller that controls the correction mechanism according to a defined relationship between a shift amount by the image shift deflector and a correction amount by the correction mechanism.

2. The charged particle beam device according to claim 1,
   wherein the correction mechanism includes a plurality of excitation coils, and
   wherein the controller controls excitation current intensities and excitation current ratios between the plurality of excitation coils, thereby deflecting the secondary charged particle beam in the correction mechanism.

3. The charged particle beam device according to claim 1,
   wherein the correction mechanism includes a plurality of electrode pairs, and
   wherein the controller controls voltages of the plurality of electrode pairs, thereby deflecting the secondary charged particle beam in the correction mechanism.

4. The charged particle beam device according to claim 1,
   wherein, when setting the control information of the correction mechanism, the controller
   generates, as a reference image, an image using the secondary charged particle beam of a first pattern under a reference image shift amount,
   determines correction amounts for differing image shift amounts such that the difference between the image using the secondary charged particle beam of the first pattern under the differing image shift amounts and the reference image under the reference image shift amount is within a defined range for each of the differing image shift amounts, and
   stores a relationship between the differing image shift amounts and the determined correction amount as a preset relationship.

5. The charged particle beam device according to claim 1,
   wherein the trajectory of the primary charged particle beam entering the magnetic sector and the trajectory of the primary charged particle beam exiting the magnetic sector and moving towards the sample are on a straight line, and
   wherein the magnetic sector deflects the secondary charged particle beam by an angle of 5 to 170 degrees.

6. The charged particle beam device according to claim 1, further comprising:
   a mirror that reverses the trajectory of the primary charged particle beam,
   wherein the magnetic sector separates the primary charged particle beam incident on the mirror from the primary charged particle beam reflected by the mirror.

7. A charged particle beam device that detects a secondary charged particle beam generated by irradiation of a sample by a primary charged particle beam, the charged particle beam device comprising:
   an image shift deflector that shifts an irradiation region for irradiation of the sample by the primary charged particle beam;
   a correction mechanism that is placed off of the trajectory of the primary charged particle beam but on the trajectory of the secondary charged particle beam, the correction mechanism deflecting the secondary charged particle beam passing through; and
   a controller that controls the correction mechanism according to a defined relationship between a shift amount by the image shift deflector and a correction amount by the correction mechanism,
   wherein, when setting the control information of the correction mechanism, the controller
   generates, as a reference image, an image of a secondary charged particle beam of a first pattern under a reference image shift amount,
   determines a correction amount for differing image shift amounts such that the difference between the image of the secondary charged particle beam of the first pattern under the differing image shift amounts and the reference image under the reference image shift amount is within a defined range for each of the differing image shift amounts, and
   stores a relationship between the differing image shift amounts and the determined correction amount as a preset relationship.

8. The charged particle beam device according to claim 7,
   wherein the controller acquires, for a calibration sample including unit cells having the same pattern and arranged periodically in two dimensions, images of the unit cells in differing positions, thereby acquiring the reference image and images at the differing image shift amounts.

9. The charged particle beam device according to claim 7,
   wherein the controller shifts the cells having the first pattern and acquires images of the cells in differing positions, thereby acquiring the reference image and images at the differing image shift amounts.

10. A control method for a charged particle beam device that detects a secondary charged particle beam generated by irradiation of a sample by a primary charged particle beam,
   wherein the charged particle beam device includes:
   an image shift deflector that shifts an irradiation region for irradiation of the sample by the primary charged particle beam;
   a magnetic sector that separates the primary charged particle beam passing therein from the secondary charged particle beam from the sample using a magnetic field generated therein; and
   a correction mechanism that is placed off of the trajectory of the primary charged particle beam but on the trajectory of the secondary charged particle beam inside the magnetic sector, the correction mechanism deflecting the secondary charged particle beam passing through, and wherein the control method comprises:
controlling the correction mechanism according to a defined relationship between a shift amount by the image shift deflector and a correction amount by the correction mechanism.

11. The control method according to claim 10, further comprising:
controlling excitation current intensities and excitation current ratios between the plurality of excitation coils of the correction mechanism, thereby deflecting the secondary charged particle beam.

12. The control method according to claim 10, further comprising:
controlling voltages of a plurality of electrode pairs of the correction mechanism, thereby deflecting the secondary charged particle beam.

13. The control method according to claim 10,
wherein, when setting the control information of the correction mechanism,
an image of a secondary charged particle beam of a first pattern in a reference image shift amount is generated as a reference image,
a correction amount for differing image shift amounts is determined such that the difference between the image of the secondary charged particle beam of the first pattern under the differing image shift amounts and the reference image under the reference image shift amount is within a defined range for each of the differing image shift amounts, and
a relationship between the differing image shift amounts and the determined correction amount is stored as a preset relationship.

14. The control method according to claim 13, further comprising:
acquiring images of unit cells in differing positions for a calibration sample including said unit cells having the same pattern and arranged periodically in two dimensions, thereby acquiring the reference image and images under the differing image shift amounts.

* * * * *